US006694504B2

(12) United States Patent
Cho et al.

(10) Patent No.: US 6,694,504 B2
(45) Date of Patent: Feb. 17, 2004

(54) METHOD OF FABRICATING AN ELECTROSTATIC VERTICAL AND TORSIONAL ACTUATOR USING ONE SINGLE-CRYSTALLINE SILICON WAFER

(75) Inventors: Dong-il Cho, Da-1004, Samho-Apartment, Bangbae-Dong, Socho-Ku, Seoul, 137-060 (KR); Jongpal Kim, Seoul (KR)

(73) Assignee: Dong-Il Cho, Seoul (KR)

( * ) Notice: Subject to any disclaimer, the term of this patent is extended or adjusted under 35 U.S.C. 154(b) by 0 days.

(21) Appl. No.: 10/139,720

(22) Filed: May 6, 2002

(65) Prior Publication Data

US 2002/0164833 A1 Nov. 7, 2002

(30) Foreign Application Priority Data

May 7, 2001 (KR) ........................................ 2001-24607

(51) Int. Cl.[7] .............................................. G06F 17/50
(52) U.S. Cl. .............................. 716/19; 716/21; 438/52
(58) Field of Search ........................ 716/19–21; 438/52, 438/489, 719, 696

(56) References Cited

U.S. PATENT DOCUMENTS

| | | | | |
|---|---|---|---|---|
| 5,846,849 A | * | 12/1998 | Shaw et al. | 438/52 |
| 6,051,866 A | * | 4/2000 | Shaw et al. | 257/417 |
| 6,150,275 A | | 11/2000 | Cho et al. | 438/696 |
| 6,569,702 B2 | * | 5/2003 | Cho et al. | 438/52 |

OTHER PUBLICATIONS

"Vertical Comb Array Microactuators", Selvakumar et al., IEEE Proc, MEMS '95, 43–48.

"Integrated Polysilicon and DRIE Bulk Silicon Micromachining For An Electrostatic Torsional Actuator", Yeh et a. IEEE/ASME J. Microelectromech. Sys 8(4), 456–465, Dec. 1999.

"Milli–scale Mirror Actuator With Bulk Micromachined Vertical Combs", Jeong et al. IEEE Proc. Transducers '99, 1006–1010, 1999.

"A Novel Electrostatic Vertical Actuator Faricated In One Homogeneous Silicon Wafer Using Extended SMB Technology", Kim et al. Sensors and Actuators A, 1–6, Dec. 2001.

"A Flat High–Frequency Scanning Micromirror", Conant et al. Proc. Hilton Head 2000, 6–13, 2000.

Abstract and Publication of Korean Patent Application 1998–11519 (Issued Patent 300,002).

* cited by examiner

Primary Examiner—Matthew Smith
Assistant Examiner—Paul Dinh
(74) Attorney, Agent, or Firm—Head, Johnson & Johnson

(57) ABSTRACT

The present invention, by improving the silicon surface/bulk micromachining technology using two steps of silicon etch mask patterning and four steps of silicon etching, fabricates a structure which has vertically offset electrodes and consequently fabricates an electrostatic vertical and torsional actuator using one single-crystalline silicon wafer. According to the method of the present invention, the problems of the prior art that used a number of silicon wafers and single/double SOI wafers, or combining of these wafers with additional deposited poly-crystalline silicon films, may be resolved.

36 Claims, 18 Drawing Sheets

Fig. 1a
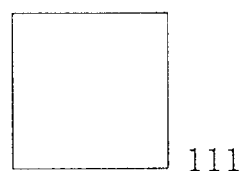 111
 112
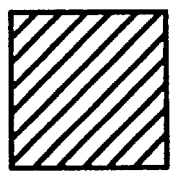 113
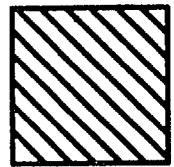 114
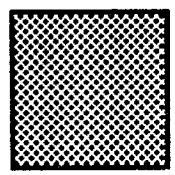 115
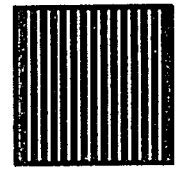 116
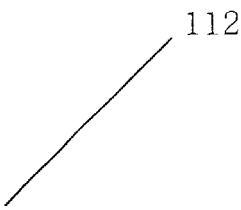

111

Fig. 11
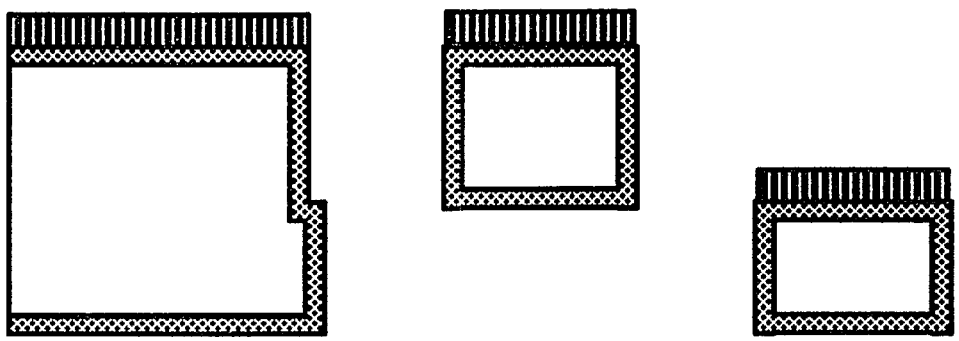
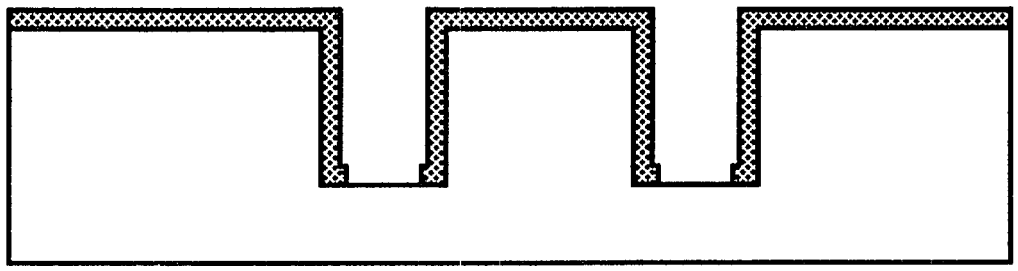

METHOD OF FABRICATING AN ELECTROSTATIC VERTICAL AND TORSIONAL ACTUATOR USING ONE SINGLE-CRYSTALLINE SILICON WAFER

CROSS-REFERENCE TO RELATED APPLICATION

This application claims priority to South Korean Application No. 2001-24607 filed May 7, 2001.

BACKGROUND OF THE INVENTION

1. Field of the Invention

The present invention relates to a method of fabricating electrostatic vertical and torsional actuators using the MEMS (Micro Electro Mechanical System) fabrication method and, more particularly, to a method of fabricating electrostatic vertical and torsional actuators using one homogenous single-crystalline silicon wafer, which is achieved by improving the prior art of using a number of bonded silicon wafers or a single/double SOI (Silicon-On-Insulator) wafer.

2. Description of the Related Art

The MEMS fabrication method relates to fabricating single devices and integrated systems of the micrometer dimension on a silicon wafer. The MEMS fabrication method has its basis on the method of fabricating silicon semiconductor electronic devices. The representative systems which are fabricated using the MEMS fabrication method are accelerometers which measure acceleration of moving objects, angular rate gyroscopes which measure angular velocity of rotating objects, and optical switches which control optical paths.

Recently, the research on the technology for fabricating high-aspect-ratio microstructures using single-crystalline silicon has been actively conducted for performing the improvement of various MEMS devices and systems. A microstructure of high-aspect-ratio has a large capacitance, which makes it possible to fabricate a sensor requiring a high precision level or an actuator which generates a strong force. In addition, a single-crystalline silicon structure does not have the problems that occur frequently, when deposited materials such as poly-crystalline silicon, or bonded materials such as SOI wafers and bonded wafers are used as the structural material. Such problems include the residual stress due to the use of deposited structural films, the residual stress from bonding different wafers, and the gradient of the residual stresses.

The surface/bulk micromachining (SBM) technology is known in the related art for fabricating a silicon microstructure of high-aspect-ratio. (Korean Patent No. 300,002 and U.S. Pat. No. 6,150,275 granted to the present applicant). According to the SBM technology, a released structure is fabricated from one homogeneous single-crystalline silicon wafer. Thus, there is no problem of residual stress or stress gradient and there is no need to stack and bond wafers as in the process of SOI or SOG (Silicon-on-Glass). However, the SBM technology is limited to fabricating devices with one planar structural layer.

The present invention relates to a method of fabricating electrostatic vertical and torsional actuators, that require two or more planar structural layers, using one homogeneous silicon wafer, by improving the above-described surface/bulk micromachining (SBM) technology. Electrostatic vertical and torsional actuators require at least two structural layers that are offset vertical layers, or two structural layers defined in different planes, in order to generate vertical forces or torquing moment. This configuration of fabricating two planar structural layers is difficult with the SBM fabrication technology.

The related art regarding a vertical or torsional actuator using the MEMS method has been introduced by Selvakumar et al. [A Selvakumar, K. Najafi, W. H. Juan and S. Pang, "Vertical comb array microactuators," IEEE Proc. MEMS '95, 43–48, 1995]. This related art is about the method of fabricating a vertical micro actuator using a vertical comb array structure, by forming a trench in a silicon wafer and refilling the formed trench by the poly-crystalline silicon deposition process.

An other related art about a vertical and torsional actuator using the MEMS method has been introduced by Yeh et al. [J. A. Yeh, H. Jiang, and N. C. Tien, "Integrated polysilicon and DRIE bulk silicon micromachining for an electrostatic torsional actuator," IEEE/ASME J. Microelectromech. Sys., 8(4), 456–465, December 1999]. This related art is about the method of fabricating an electrostatic torsional actuator by using a poly-crystalline silicon film and DRIE (Deep Reactive Ion Etching) bulk silicon micromachined parts of a SOI wafer.

In the above-mentioned related arts, deposited poly-crystalline silicon films are used as moving structures, which are defined in a different plane than fixed structures.

Another related art has been introduced by Jeong et al. [H. Jeong, J. Choi, K. Y. Kim, K. B. Lee, J. U. Jeon and Y. E. Pak, "Milli-scale mirror actuator with bulk micromachined vertical combs," IEEE Proc. Transducers '99, 1006–1010, 1999]. This related art is about a millimeter scale secondary mirror actuator with DRIE bulk micromachined vertical combs fabricated by stacking and bonding a number of silicon and glass wafers.

Conant et al. [R. A. Conant, J. T. Nee, K. Y. Lau, and R. S. Muller, "A flat high-frequency scanning micromirror," Proc. Hilton Head 2000, 6–13, 2000] fabricated a torsional mirror by forming of lower electrodes on a substrate silicon wafer, bonding another cap silicon wafer on the substrate silicon wafer, grinding the two silicon wafers, and then, forming upper electrodes on the cap silicon wafer.

Generally, it is very difficult to fabricate an actuator that moves vertically or torsionally on one single-crystalline silicon wafer. Accordingly, as in the above-mentioned related arts, a number of stacked-silicon wafers or single/double SOI wafers or combining of these wafers with deposited poly-crystalline silicon films have inevitably been used. Also, separate photomasks are generally used for fabricating the upper electrode and the lower electrode of the actuator. Thus, it is difficult to align the gap between the upper electrode and the lower electrode to a precise dimension, due to the alignment errors generated in aligning different photomasks.

SUMMARY OF THE INVENTION

The present invention, to resolve the above-described problems of the related art, has its purpose in providing a method of fabricating an electrostatic vertical and torsional actuator using one homogeneous silicon wafer, by improving the surface/bulk micromachining (SBM) method.

In order to achieve the above-mentioned purpose, the present invention fabricates an electrostatic combs with a vertical offset and horizontal gap using one single-crystalline silicon wafer(111) by improving the SBM technology, which is achieved by using two steps of silicon etch mask patterning and four steps of silicon etching process, wherein the etching depth may be controlled to achieve arbitrary comb dimensions and the vertical offset distance between the moving combs and the fixed combs, as well as the vertical space between the two said sets of combs.

More specifically, the method according to the present invention comprises the following steps:

step (a) of depositing silicon etch mask 1(112) on a silicon wafer and patterning it by the first photolithography process, thereby determining all the planar dimensions of the vertical or torsional actuator from the same photomask;

step (b) of depositing silicon etch mask 2(113) on top of the already patterned silicon etch mask 1(112) of step (a), and patterning it by the second photolithography process, making the upper comb electrodes of the vertical or torsional actuator to be completely covered by the silicon etch mask 2(113), while parts of silicon substrate is exposed;

step (c) of performing the first silicon etching by an amount of $t_1$, during which the silicon etch mask 2(113) and the parts of the silicon etch mask 1(112) that is not covered with the silicon etch mask 2(113) are also simultaneously etched, such that the silicon etch mask 1(112) has different thicknesses between the parts that are covered with the silicon etch mask 2(113) and the parts that are not covered with the silicon etch mask 2(113);

step (d) of removing the silicon etch mask 2(113);

step (e) of determining the thickness of the upper electrode(118) by performing the second silicon etching by an amount of $t_2$ in the state where the silicon etch mask 2(113) has been removed at the step (d);

step (f) of depositing a wall protection layer(114) on the vertical sidewalls of the structure which has been formed through the step (e);

step (g) of determining the vertical gap between the substrate and the lower electrode(119) by performing the third silicon etching by an amount of $t_3$ after the step (f);

step (h) of laterally underetching silicon parts that are not covered with the protection layer and that are exposed in the step (g), in the horizontal direction using aqueous alkaline etchant, such that the body of the structure and various combs are released from the main wafer substrate;

step (i) of, to the structure formed through the step (h), etching the silicon etch mask 1(112) by the amount of the thickness of the silicon etch mask 1(112) at the thinner parts within the silicon etch mask 1(112), where the thickness difference of the silicon etch mask 1(112) is caused by the etching of the exposed part of the silicon etch mask 1(112) which are not covered with the silicon etch mask 2(113) at the step (c), and determining the vertical offset between the upper and lower electrodes(119) by performing the fourth silicon etching by an amount of $t_4$; and step (j) of removing the wall protection layer(114), which has been formed at the step (f), and removing the silicon etch mask 1(112), which is formed at the step (a).

Description of the code at an important part of a diagram
111: Single-crystalline Silicon Wafer,
112: Silicon Etch Mask 1,
113: Silicon Etch Mask 2,
114: Wall Protection Layer,
115: Doped poly-Si Layer on Insulating Layer,
116: Metal,
117: Structure,
118: Upper Electrode,
119: Lower Electrode.

DETAILED DESCRIPTION OF THE PREFERRED EMBODIMENT

Hereinafter, a detailed description will be given with references to the accompanying drawings as to the method of fabricating electrostatic vertical and torsional actuators using one single-crystalline silicon wafer(111) in accordance with the present invention.

FIG. 1 is a diagram illustrating the fabrication process of the method of fabricating an electrostatic vertical and torsional actuator using one single-crystalline silicon wafer (111) according to the present invention. Specifically, it explains the method of using the single-crystalline silicon wafer(111), improving the prior art referenced earlier as the SBM technology.

First, silicon etch mask 1(112) is deposited on the single-crystalline silicon wafer(111). A silicon dioxide film or any other suitable masking material for silicon dry etching may be used as the material for the silicon etch mask 1(112). An additional silicon nitride film can be deposited prior to the silicon etch mask 1(112) for an added protection of silicon against alkaline etching at a later time. At this time, the silicon etch mask 1(112) should be thick enough to endure the ensuing four silicon etching steps and the two etch mask dry etching steps. A photoresist is applied on the silicon etch mask 1(112) and patterned in the first photolithography process. Using the photoresist pattern as a soft etch mask, the silicon etch mask 1(112) is dry etched, and the photoresist is removed (FIG. 1a). In this first photolithography process, all planar dimensions including the size of the upper electrode(118), the size of the lower electrode(119), and all lateral gaps, including the lateral gap between the electrodes of the actuator, are determined.

Figure 1B:
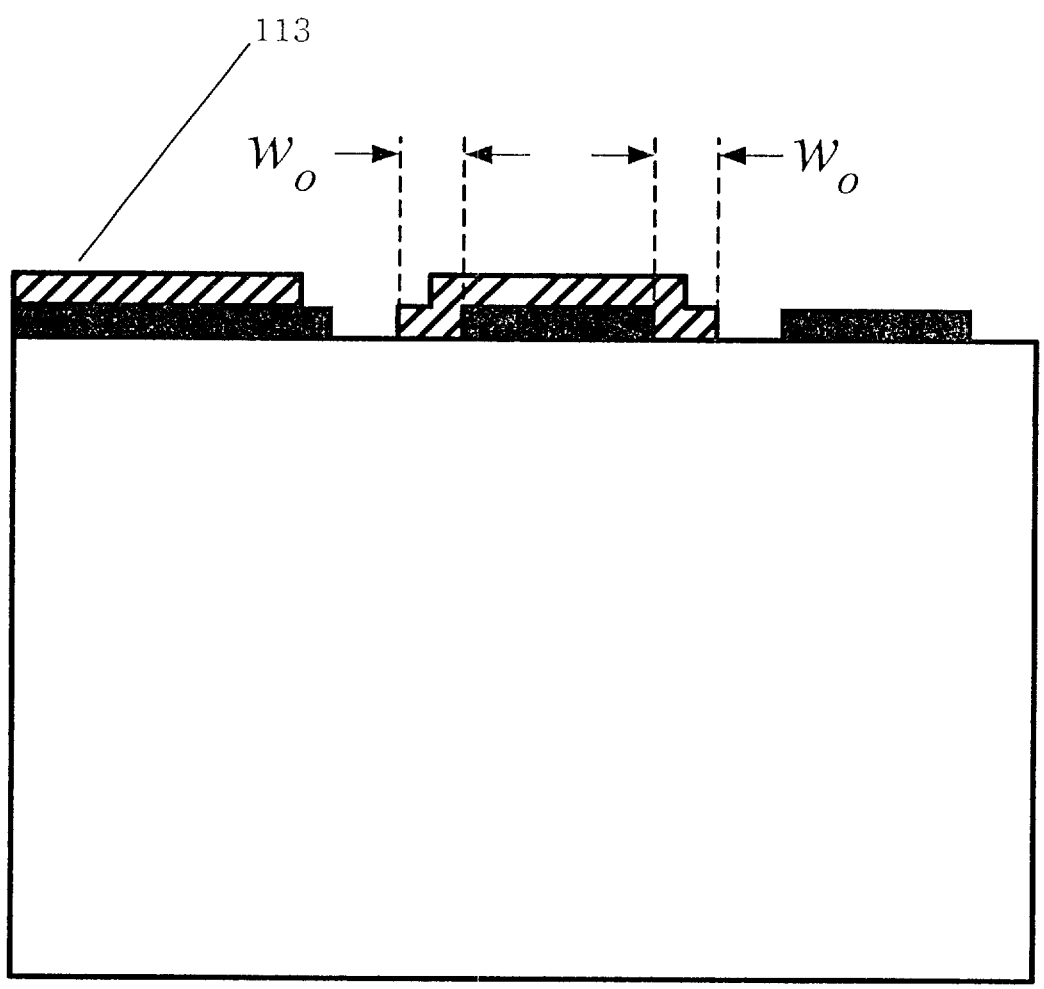
FIG. 1 is a diagram illustrating the fabrication process of the method of fabricating the driving combs and fixed combs of electrostatic vertical and torsional actuators, using one single-crystalline silicon wafer(111) according to the present invention.

As the next step, photoresist is spun on as the silicon etch mask 2(113), and patterned using the second photolithographic mask (FIG. 1b). Any other masking material suitable for silicon dry etching can also be used as the material for the silicon etch mask 2(113). The silicon etch mask 1(112) pattern which is completely covered with the silicon etch mask 2(113) pattern is the part which becomes the upper electrode(118) and the springs that tether the body of the structure to the silicon substrate. The pattern size of the silicon etch mask 2(113) should be larger than the pattern size of the silicon etch mask 1(112) by $w_o$ for the case of the upper electrode(118). The dimension $w_o$ is determined by considering an alignment tolerance between the first and second photolithography processes and the minimum width required for performing the second silicon dry etching. However, the alignment error in the second photolithography process does not make a difference in the planar dimension of the final structure.

Figure 1C:
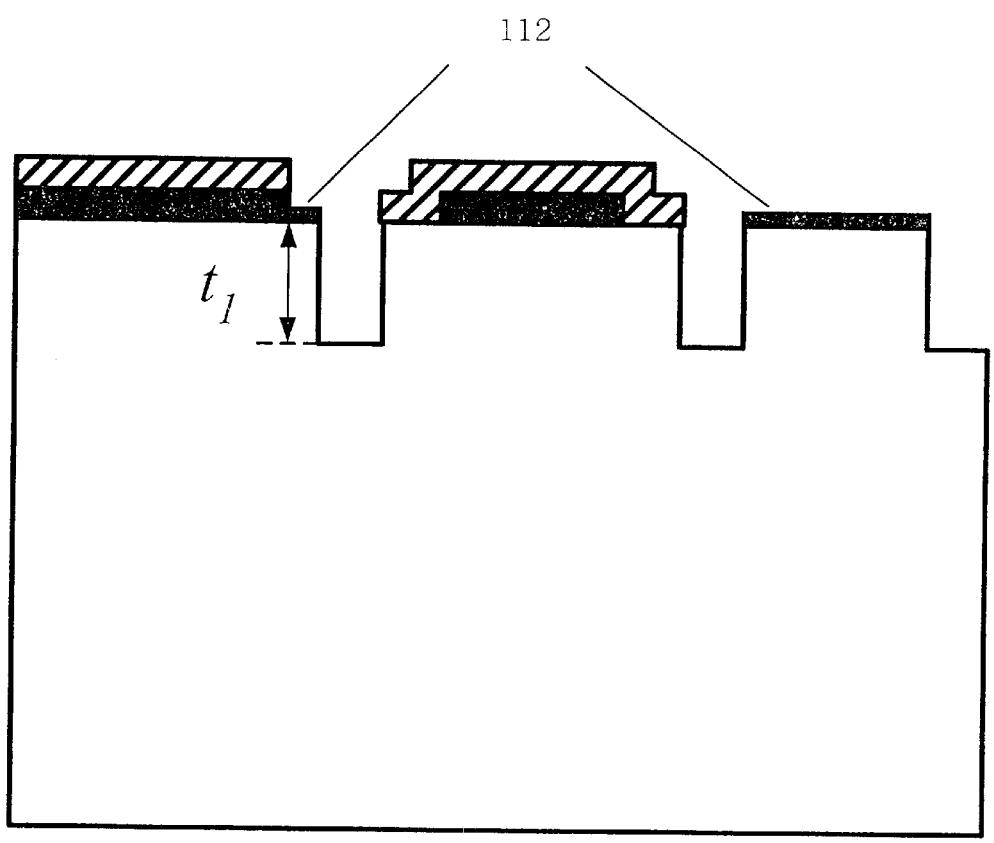
Figure 1D:
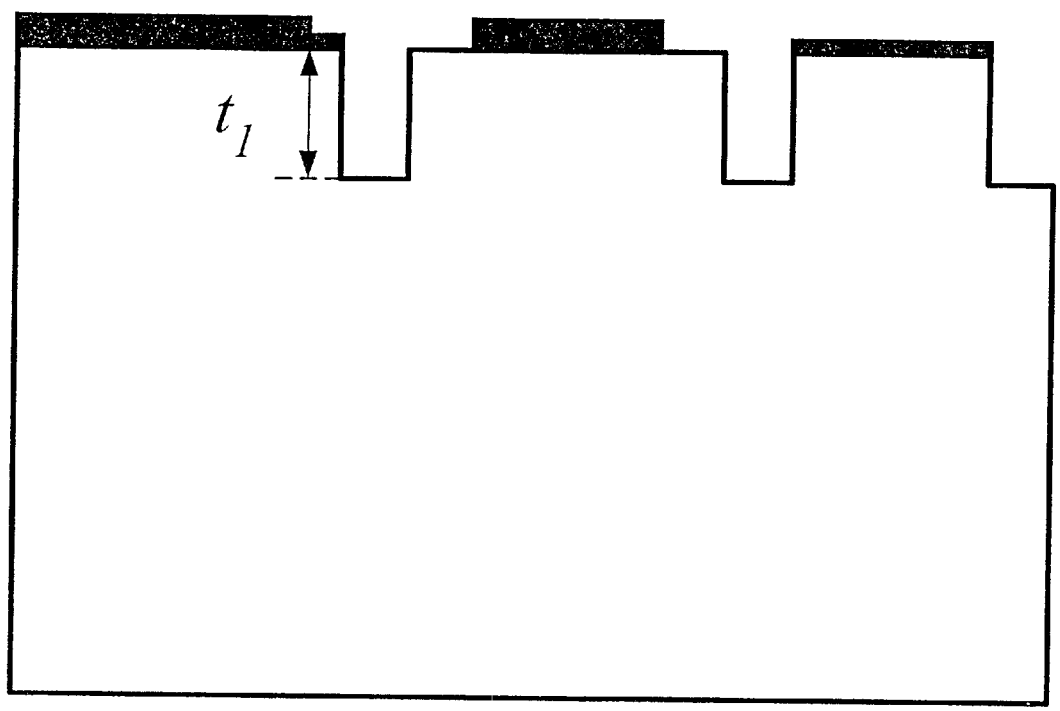

Next, the first silicon etching by an amount of $t_1$ is performed (FIG. 1c). At this step, some parts of the silicon etch mask 1(112) are protected by the silicon etch mask 2(113), and some other parts of the silicon etch mask 1(112) are not protected by the silicon etch mask 2(113). During the silicon etching, both the silicon etch masks 1 and 2 are also etched, but at a much slower rate than silicon. Consequently, the parts of the silicon etch mask 1(112), that are not covered with the silicon etch mask 2(113) become thinner than the parts of the silicon etch mask 1(112) that are covered with the silicon etch mask 2(113). This difference in the thickness of the silicon etch mask 1(112) is exaggerated in FIG. 1c for clarity. If the difference in the thickness of the silicon etch mask 1(112) is less than desirable, which can occur if the silicon etch depth $t_1$ is small so that only a negligible amount of the silicon etch mask 1(112) is etched, an additional silicon etch mask 1(112) etching step can be added. The silicon under the thicker parts of the silicon etch mask 1(112) becomes the upper electrode(118) and the silicon under the thinner parts of the silicon etch mask 1(112) becomes the lower electrode(119).

Figure 1E:
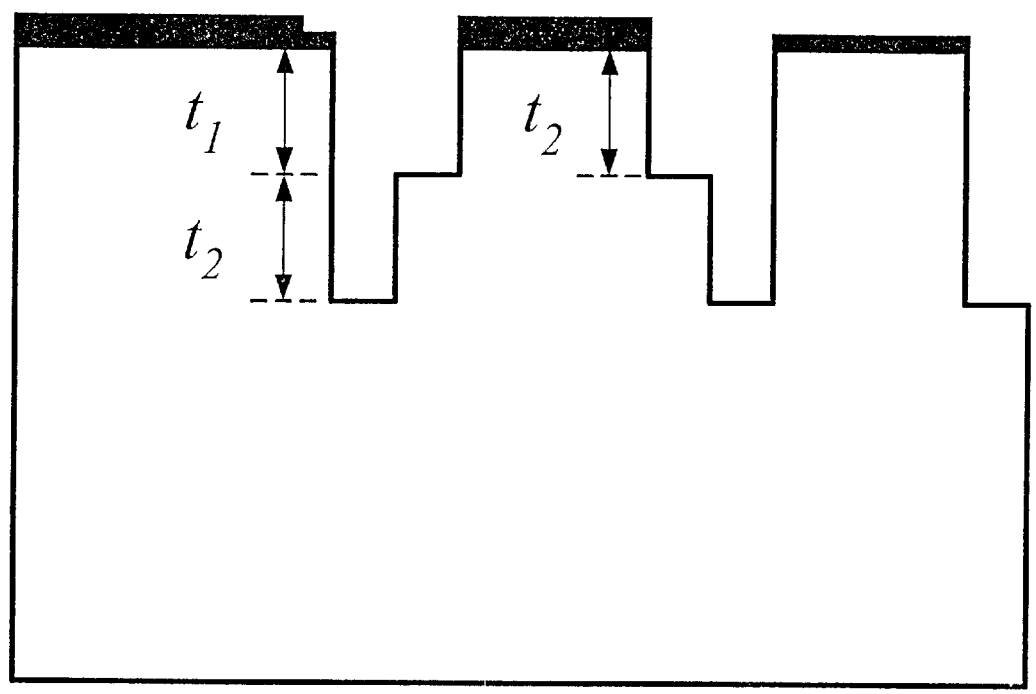

With the difference in the thickness of the silicon etch mask 1(112) in various parts of a wafer as explained in the above, the silicon etch mask 2(113) is removed (FIG. 1d) and the second silicon etching is performed (FIG. 1e). The second silicon etching depth $t_2$ determines the thickness of the upper electrode(118). Note that the silicon etch mask 1(112) will also become thinner everywhere, and this is not shown in the figure.

Figure 1F:
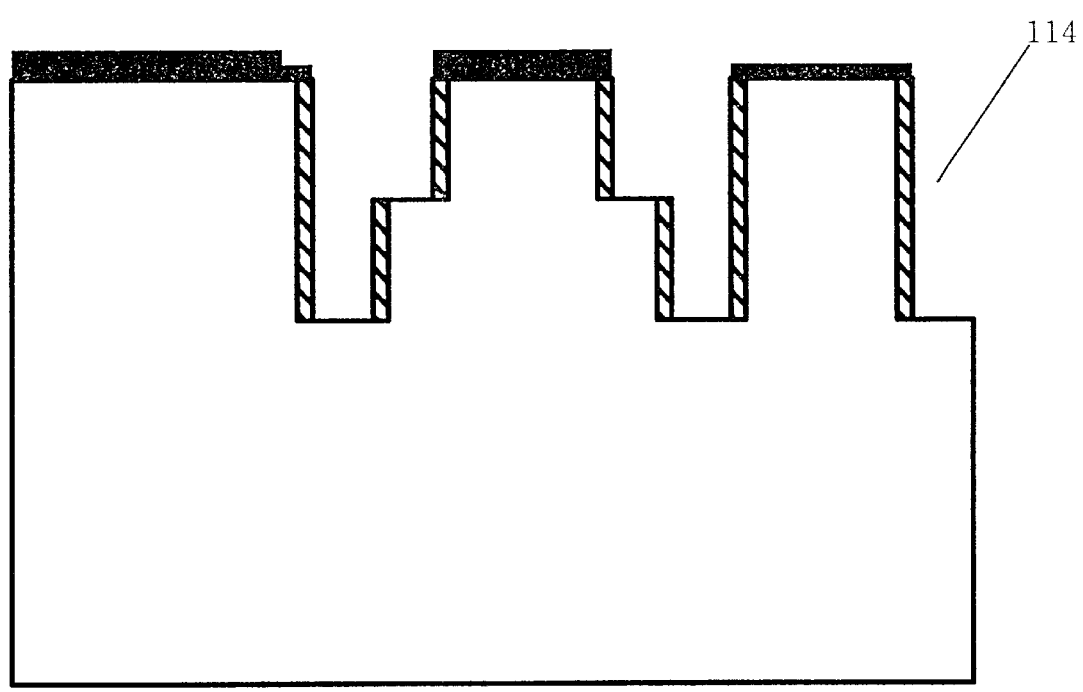
Figure 1G:
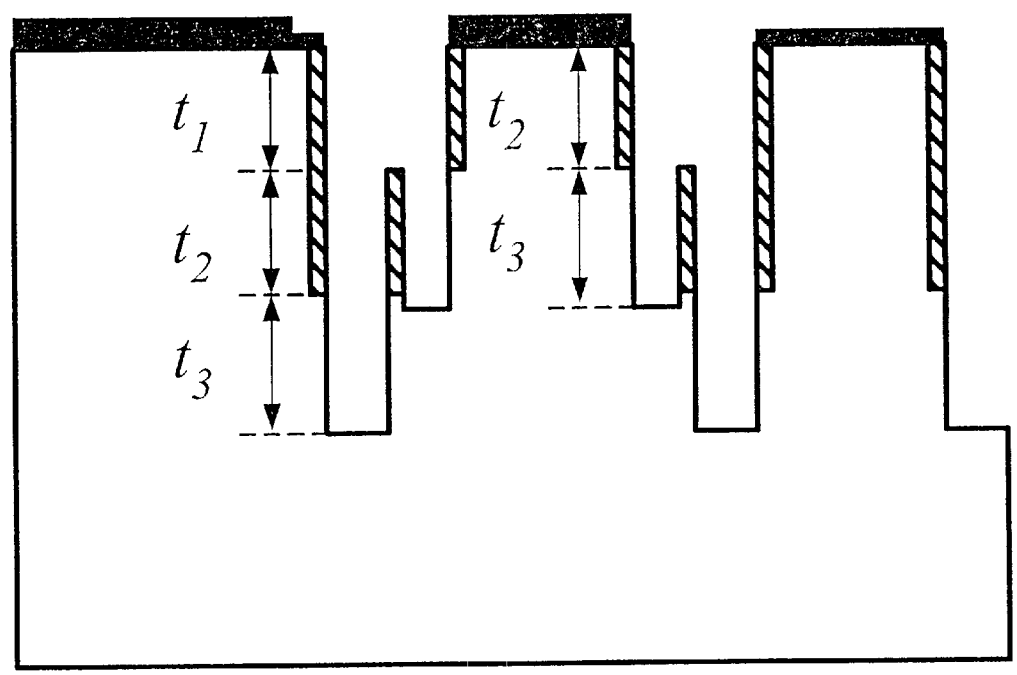
Figure 1H:
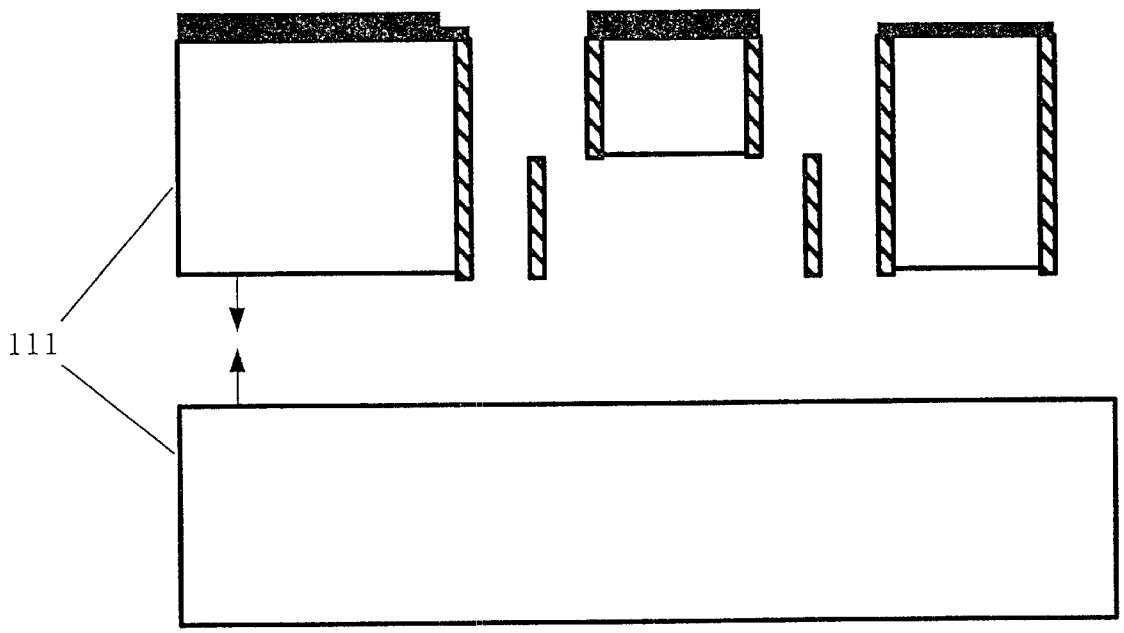

Then, a wall protection layer(114) is deposited (FIG. 1f). Various silicon dioxide and nitride films, or any of their combinations may be used as the material of the wall protection layer(114). The method to achieve depositing the protection layer only on the sidewalls is described in detail in Korean patent No. 300,002 and U.S. Pat. No. 6,150,275.

Then, the third silicon etching is performed by an amount of $t_3$. The vertical gap between the silicon substrate and the lower electrode(119) is determined at this step. Note that the silicon etch mask 1(112) will also become thinner everywhere, and this is not shown in the figure. The etching depth $t_3$ of the third silicon etching should be greater than the etching depth $t_1$ of the first silicon etching.

If this condition is not satisfied, shadow structures can be generated at the lower part of the upper electrode(118). The bottom side of the shadow structure is located at the same position as the bottom side of the lower electrode(119) and the top side of the shadow structure is located at the position $t_2+t_1-t_3$. Also, the width of the shadow structure is the same as the width of the silicon etch mask 2(113).

Then, the silicon parts without the sidewall protection layer(114) are laterally underetched using an alkaline solution (FIG. 1h), such that the body of the structure and various combs are released from the main wafer substrate, except in parts where the structure is intended to be tethered to the silicon substrate.

Figure 1I:
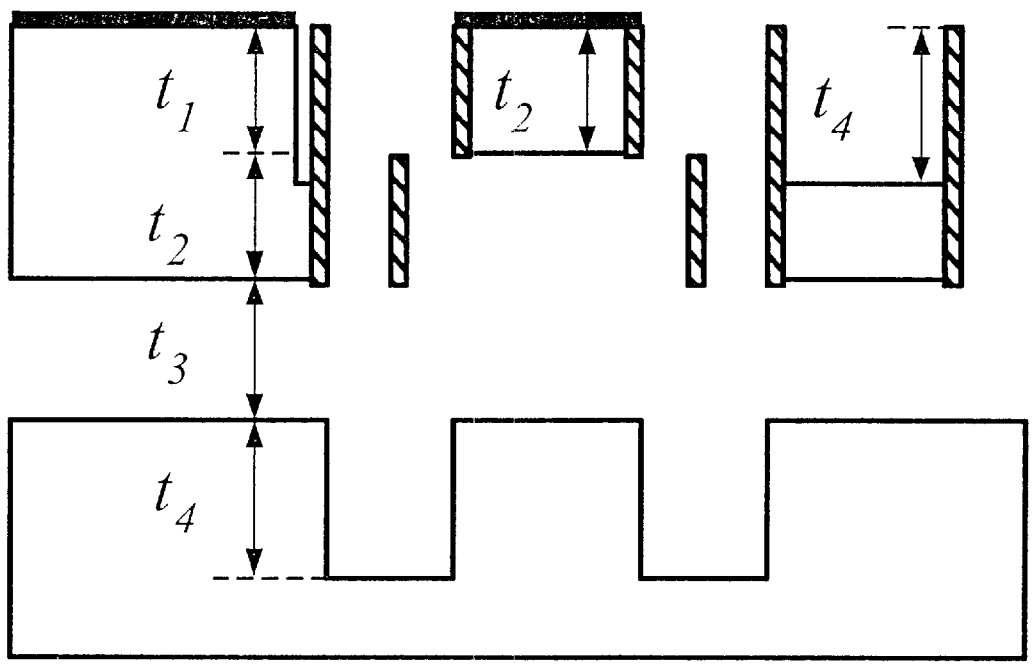
Figure 1J:
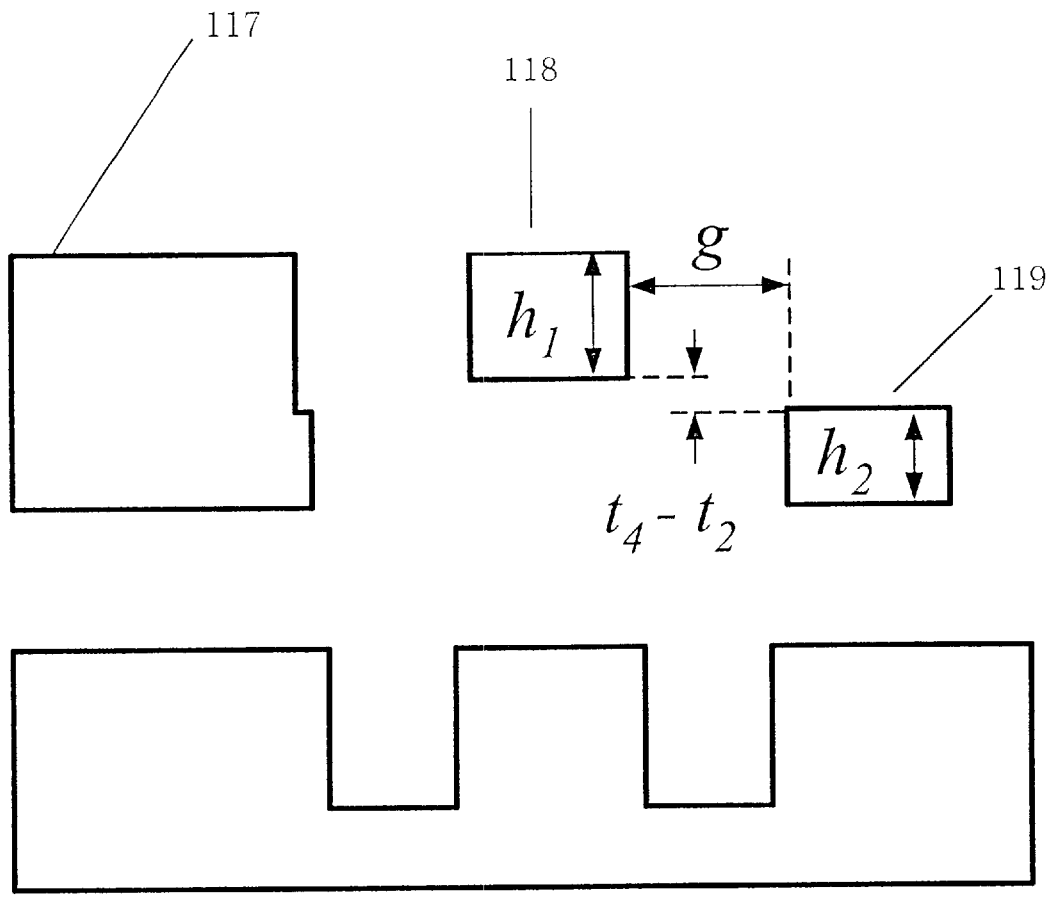

Thereafter, the silicon etch mask 1(112) material is etched until the thin parts of the silicon etch mask 1(112) are completely removed, exposing bare silicon in these portions. These parts represent the lower electrode(119). The thicker parts of silicon etch mask 1(112), which are on the upper electrode(118), become thinner but still remain on top of the upper electrodes (118) to protect the upper electrodes(118) in the ensuing fourth silicon etch. Thereafter, when the fourth silicon etching is performed to a depth $t_4$, the result becomes as shown in FIG. 1i, where the top of the lower electrode(119) is recessed. The remaining silicon etch mask 1(112) also become thinner during the fourth silicon etching step, but this is not shown in the figure for clarity. The vertical offset between the top surface of the upper electrode (118) and the top surface of the lower electrode(119) is defined in this step. The vertical offset between the upper and lower electrodes(119) can be such that, the lower electrode(119) can be completely below the upper electrode (118) or the two electrodes can partially overlap. Finally, the removal of the silicon etch mask 1(112) and the wall protection layer(114) completes the fabrication process for the structure(117) (FIG. 1j). FIG. 1j shows the fabricated upper(118) and lower(119) electrodes of a vertical and torsional actuator.

Some important dimensions of the electrostatic vertical and torsional actuator fabricated according to the present process are as follows. The thickness of the upper electrode (118) and the tether spring ($h_1$) is $t_2$, the thickness of the lower electrode(119) ($h_2$) is $t_1+t_2-t_4$, the vertical gap between the two electrodes is $t_4-t_2$, and the vertical gap between the silicon substrate and the lower electrode(119) is $t_3$.

Figure 1K:
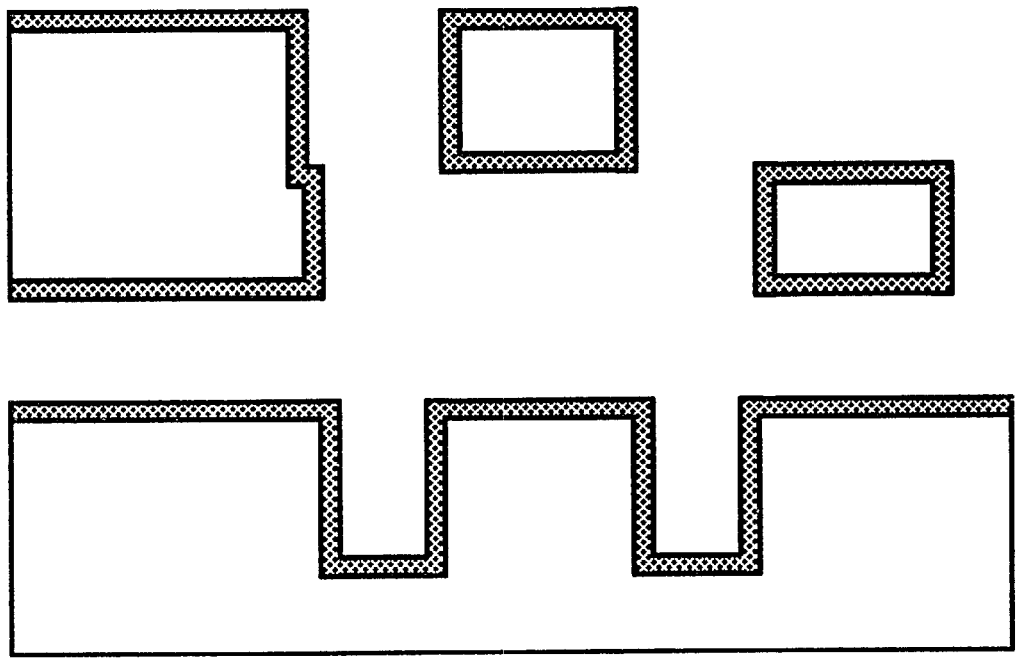
Figure 2A:
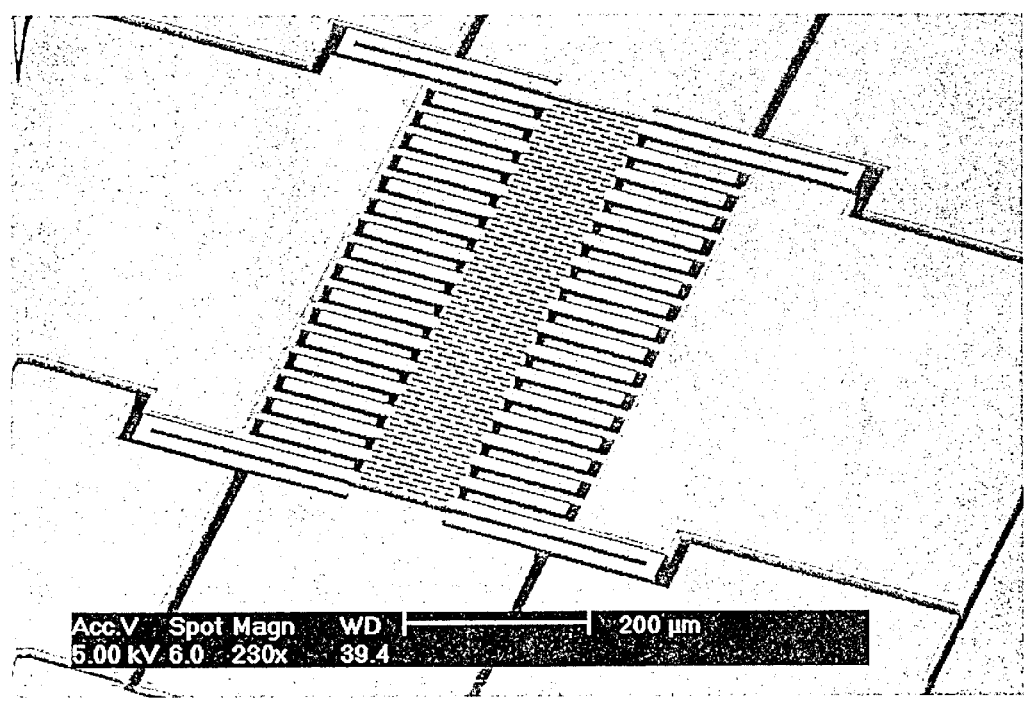
FIG. 2 shows SEM (Scanning Electron Microscopy) pictures illustrating vertical or torsional actuators and a vertical axis accelerometer fabricated according to the present invention.
Figure 2B:
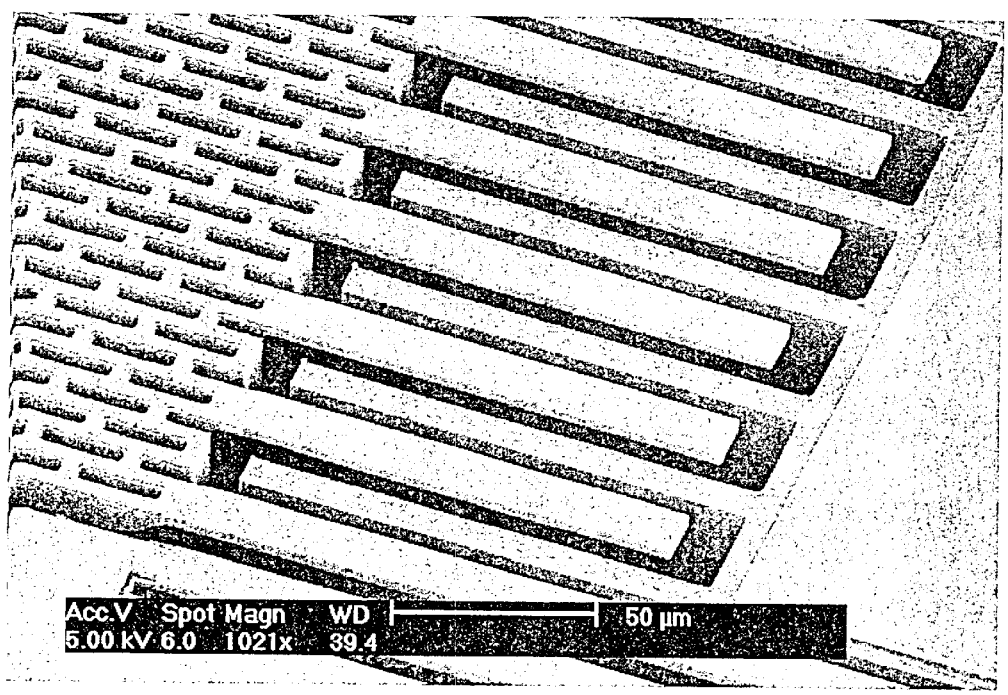
Figure 2C:
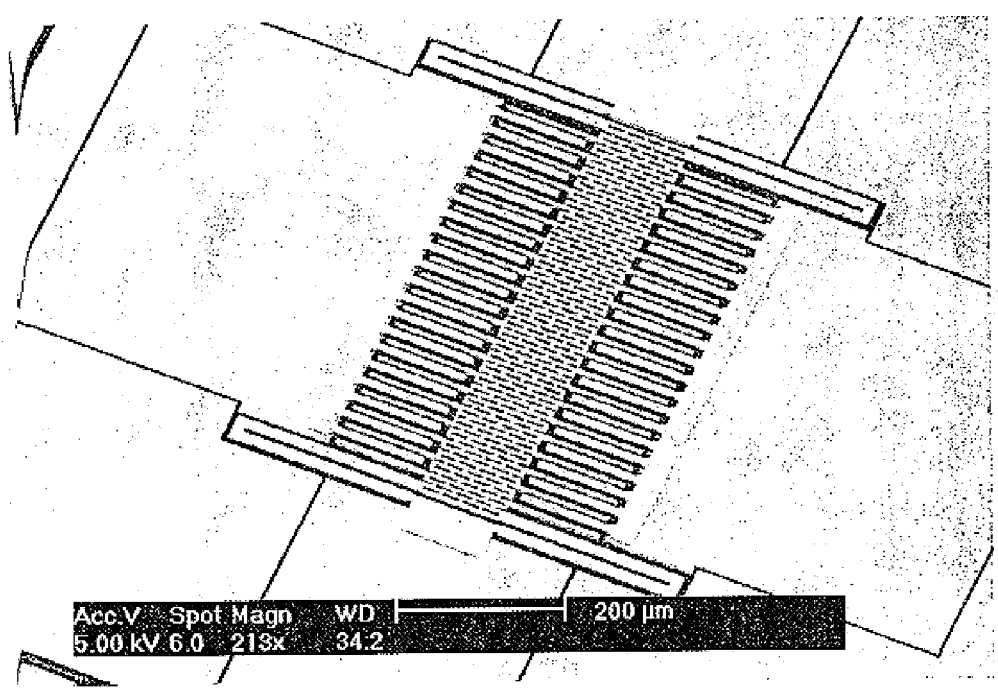
Figure 2D:
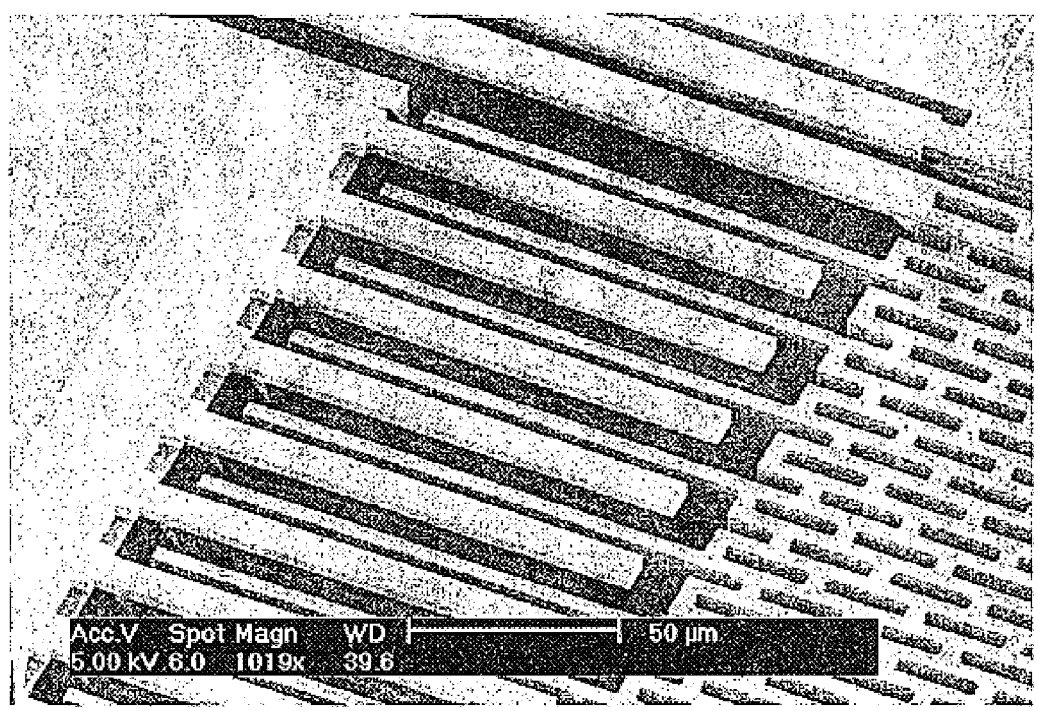
Figure 2E:
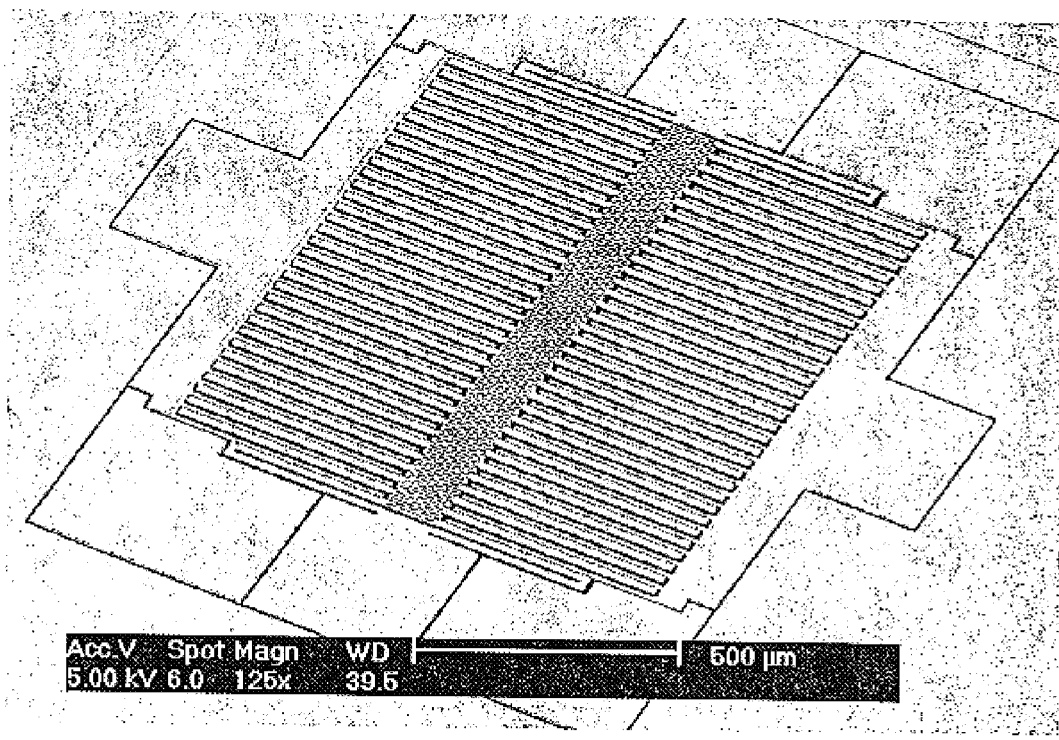
Figure 2F:
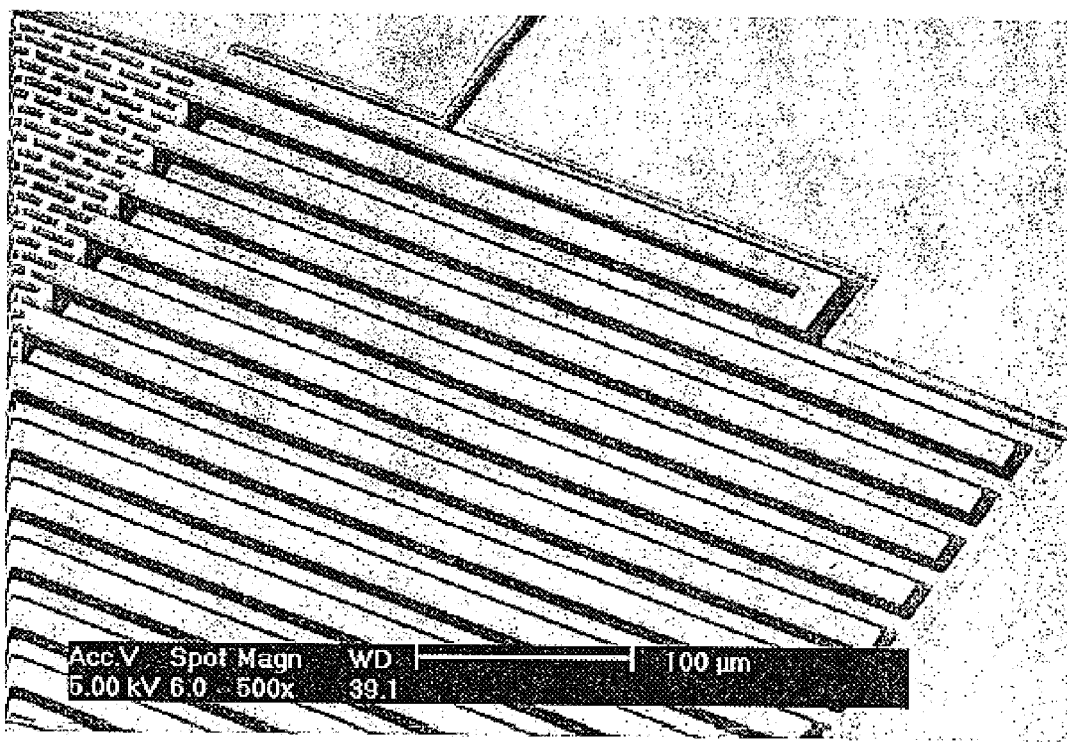

For electrostatic driving, electrical isolation of electrodes is required. In order to achieve this electrical isolation, the isolation method of using refilled oxide trenches and pillars [U.S. patent application Ser. No. 09/756,981, Korea Patent Application No. 2000-01550], the isolation method of using a triple layer of oxide/poly-crystalline silicon/metal [U.S. patent application Ser. No. 09/903,280, Korea Patent Application No. 2000-37659, Korea Patent Application No. 2000-401211], or the isolation method of using a selective SOI structure [Korea Patent Application No. 2001-19656] may be used. The isolation method of using the conventional SOI wafers can also be used. Without prejudice to other isolation methods, the method of using a triple layer is illustrated. Firstly, thermal silicon dioxide with the thickness of 1200 Å is deposited on all the silicon surfaces, and then doped poly-crystalline silicon with the thickness of 1800 Å is deposited thereon (FIG. 1k). Thereafter, the anisotropic etching of the thin poly-crystalline silicon shell is performed by using the metal(116) of the upper layer as an etch mask (FIG. 1l). The poly-crystalline silicon etching steps removes silicon at the top and exposed bottom surfaces.

FIG. 2 shows SEM pictures of various vertical and torsional actuators and a vertical accelerometer that are fabricated by the process illustrated in FIG. 1. Important vertical dimensions of these structures illustrated in FIG. 2 are as follows. $t_1=20$ μm, $t_2=5$ μm, $t_3=30$ μm, and $t_4=6$ μm. The gap between the sides of two electrodes is 6 μm. In particular, FIG. 2a is the overall picture of a vertical and torsional actuator 1, FIG. 2b is an enlarged picture of the lower right part of this actuator 1, FIG. 2c is the overall picture of a vertical and torsional actuator 2, FIG. 2d is an enlarged picture of the upper left part of this actuator 2, FIG. 2e is the overall picture of a vertical axis accelerometer, and FIG. 2f is an enlarged picture of the upper right part of this vertical axis accelerometer. Note that by simultaneously applying electrostatic forces on both the right and left electrodes of the actuators 1 or 2, the suspended part is vertically displaced downward, and by applying electrostatic forces on only the right electrodes or the left electrodes, the suspended part is rotated about the center axis in the counterclockwise direction or the clockwise direction, respectively.

According to the present invention, electrostatic vertical and torsional actuators can be fabricated with one homogeneous single-crystalline silicon wafer(111). Using the method suggested in the present invention, the problems of the related art of using a number of silicon wafers or single/double SOI wafers, are resolved.

The method according to the present invention is applicable to a vertical direction sensor of a vertical axis accelerometer, a vertical sensor/vertical actuator of a horizontal axis gyroscope, or a torsional actuator of an optical switching device.

What is claimed is:

1. A method of fabricating an electrostatic vertical and torsional actuator using the micro electro mechanical system fabrication technology, comprising the following steps:

step (a) of depositing silicon etch mask 1 on a silicon wafer and patterning it by a first photolithography process, thereby determining all planar dimensions of the electrostatic vertical and torsional actuator from a same photomask;

step (b) of depositing silicon etch mask 2 on to of the already patterned etch mask 1 of step (a), and patterning it by a second photolithography process, making upper comb electrodes of the electrostatic vertical and torsional actuator to be completely covered by the silicon etch mask 2, while parts of a silicon substrate is exposed;

step (c) of performing a first silicon etching by an amount of $t_1$, during which the silicon etch mask 2 and parts of the silicon etch mask 1 that are not covered with the silicon etch mask 2 are also simultaneously etched, such that the silicon etch mask 1 has different thicknesses between parts that are covered with the silicon etch mask 2 and parts that are not covered with the silicon etch mask 2;

step (d) of removing the silicon etch mask 2;

step (e) of determining a thickness of the upper electrode by performing a second silicon etching by an amount of $t_2$ in a state where the silicon etch mask 2 has been removed at said step (d);

step (f) of depositing a wall protection layer on vertical sidewalls of the structure which has been formed during said step (e);

step (g) of determining a vertical gap between the substrate and a lower electrode by performing a third silicon etching by an amount of $t_3$ after said step (f);

step (h) of laterally underetching silicon parts that are not covered with the wall protection layer and that are exposed in said step (g), in a horizontal direction using aqueous alkaline etchant, such that the body of the structure formed in said previous steps and its various combs are released from the main silicon wafer substrate;

step (i) of, to the structure formed through said step (h), etching the silicon etch mask 1 by an amount of the thickness of the silicon etch mask 1 at the thinner parts within the silicon etch mask 1, where the thickness difference of the silicon etch mask 1 is caused by the etching of the exposed part of the silicon etch mask 1 which are not covered with the silicon etch mask 2, at said step (c) and determining a vertical offset between the upper electrode and the lower electrode by performing a fourth silicon etching by an amount of $t_4$; and step (j) of removing the wall protection layer, which has been formed at said step (f), and removing the silicon etch mask 1, which is formed during said step (a).

2. The method of fabricating of an electrostatic vertical and torsional actuator according to claim 1, wherein the silicon wafer is a single-crystalline silicon wafer.

3. The method of fabricating an electrostatic vertical and torsional actuator using one silicon wafer according to claim 1, wherein said steps (c), (e), (g) and (i) are performed by anisotropically dry etching silicon.

4. The method of fabricating an electrostatic vertical and torsional actuator using one silicon wafer according to claim 1, wherein a size of the pattern of the silicon etch mask 2 formed at said step (b) is greater, by $w_o$, than the pattern size of silicon etch mask 1.

5. The method of fabricating an electrostatic vertical and torsional actuator using one single-crystalline silicon wafer according to claim 4, wherein the $w_o$ is determined by considering alignment tolerance between said first and second photolithography processes and a minimum width required for performing said third silicon etching at said step (g).

6. The method of fabricating an electrostatic vertical and torsional actuator using one silicon wafer according to claim 1, wherein an isolation method using trenches filled with insulating materials or pillars of insulating materials is applied for electrical isolation of each electrode.

7. The method of fabricating an electrostatic vertical and torsional actuator using one silicon wafer according to claim 1, wherein an isolation method using a triple layer of insulator/poly-crystalline silicon/metal is applied for electrical isolation of each electrode.

8. The method of fabricating an electrostatic vertical and torsional actuator using one silicon wafer according to claim 1, wherein an isolation method using a selective silicon-on-insulator structure is applied for electrical isolation of each electrode.

9. The method of fabricating an electrostatic vertical and torsional actuator using one silicon wafer according to claim 1, wherein a conventional silicon-on-insulator wafer is applied for electrical isolation of each electrode.

10. The method of fabricating an electrostatic vertical and torsional actuator using one silicon wafer according to claim 1, wherein said method is applied to a vertical direction sensor of a vertical axis accelerometer.

11. The method of fabricating an electrostatic vertical and torsional actuator using one single-crystalline silicon wafer according to claim 2, wherein said method is applied to a vertical direction sensor of a vertical axis accelerometer.

12. The method of fabricating an electrostatic vertical and torsional actuator using one single-crystalline silicon wafer according to claim 3, wherein said method is applied to a vertical direction sensor of a vertical axis accelerometer.

13. The method of fabricating an electrostatic vertical and torsional actuator using one single-crystalline silicon wafer according to claim 4, wherein said method is applied to a vertical direction sensor of a vertical axis accelerometer.

14. The method of fabricating an electrostatic vertical and torsional actuator using one single-crystalline silicon wafer according to claim 5, wherein said method is applied to a vertical direction sensor of a vertical axis accelerometer.

15. The method of fabricating an electrostatic vertical and torsional actuator using one single-crystalline silicon wafer according to claim 6, wherein said method is applied to a vertical direction sensor of a vertical axis accelerometer.

16. The method of fabricating an electrostatic vertical and torsional actuator using one single-crystalline silicon wafer according to claim 7, wherein said method is applied to a vertical direction sensor of a vertical axis accelerometer.

17. The method of fabricating an electrostatic vertical and torsional actuator using one single-crystalline silicon wafer according to claim 8, wherein said method is applied to a vertical direction sensor of a vertical axis accelerometer.

18. The method of fabricating an electrostatic vertical and torsional actuator using one single-crystalline silicon wafer according to claim 9, wherein said method is applied to a vertical direction sensor of a vertical axis accelerometer.

19. The method of fabricating an electrostatic vertical and torsional actuator using one silicon wafer according to claim 1, wherein said method is applied to a vertical and torsional sensor or actuator for sensing a horizontal axis gyroscope.

20. The method of fabricating an electrostatic vertical and torsional actuator using one single-crystalline silicon wafer according to claim 2, wherein said method is applied to a vertical and torsional sensor or actuator for sensing a horizontal axis gyroscope.

21. The method of fabricating an electrostatic vertical and torsional actuator using one single-crystalline silicon wafer according to claim 3, wherein said method is applied to a vertical and torsional sensor or actuator for sensing a horizontal axis gyroscope.

22. The method of fabricating an electrostatic vertical and torsional actuator using one single-crystalline silicon wafer according to claim 4, wherein said method is applied to a vertical and torsional sensor or actuator for sensing a horizontal axis gyroscope.

23. The method of fabricating an electrostatic vertical and torsional actuator using one single-crystalline silicon wafer according to claim 5, wherein said method is applied to a vertical and torsional sensor or actuator for sensing a horizontal axis gyroscope.

24. The method of fabricating an electrostatic vertical and torsional actuator using one single-crystalline silicon wafer according to claim 6, wherein said method is applied to a vertical and torsional sensor or actuator for sensing a horizontal axis gyroscope.

25. The method of fabricating an electrostatic vertical and torsional actuator using one single-crystalline silicon wafer according to claim 7, wherein said method is applied to a vertical and torsional sensor or actuator for sensing a horizontal axis gyroscope.

26. The method of fabricating an electrostatic vertical and torsional actuator using one single-crystalline silicon wafer according to claim 8, wherein said method is applied to a vertical and torsional sensor or actuator for sensing a horizontal axis gyroscope.

27. The method of fabricating an electrostatic vertical and torsional actuator using one single-crystalline silicon wafer according to claim 9, wherein the method is applied to a vertical and torsional sensor or actuator for sensing a horizontal axis gyroscope.

28. The method of fabricating an electrostatic vertical and torsional actuator using one single-crystalline silicon wafer according to claim 1, wherein said method is applied to a vertical and torsional sensor or actuator including an optical switching device.

29. The method of fabricating an electrostatic vertical and torsional actuator using one single-crystalline silicon wafer according to claim 2, wherein said method is applied to a vertical and torsional sensor or actuator including an optical switching device.

30. The method of fabricating an electrostatic vertical and torsional actuator using one single-crystalline silicon wafer according to claim 3, wherein said method is applied to a vertical and torsional sensor or actuator including an optical switching device.

31. The method of fabricating an electrostatic vertical and torsional actuator using one single-crystalline silicon wafer according to claim 4, wherein said method is applied to a vertical and torsional sensor or actuator including an optical switching device.

32. The method of fabricating an electrostatic vertical and torsional actuator using one single-crystalline silicon wafer according to claim 5, wherein said method is applied to a vertical and torsional sensor or actuator including an optical switching device.

33. The method of fabricating an electrostatic vertical and torsional actuator using one single-crystalline silicon wafer according to claim 6, wherein said method is applied to a vertical and torsional sensor or actuator including an optical switching device.

34. The method of fabricating an electrostatic vertical and torsional actuator using one single-crystalline silicon wafer according to claim 7, wherein said method is applied to a vertical and torsional sensor or actuator including an optical switching device.

35. The method of fabricating an electrostatic vertical and torsional actuator using one single-crystalline silicon wafer according to claim 8, wherein said method is applied to a vertical and torsional sensor or actuator including an optical switching device.

36. The method of fabricating an electrostatic vertical and torsional actuator using one single-crystalline silicon wafer according to claim 9, wherein said method is applied to a vertical and torsional sensor or actuator including an optical switching device.

* * * * *